United States Patent [19]

Moore et al.

[11] 4,249,228
[45] Feb. 3, 1981

[54] HOUSING FOR AN ELECTRICAL CIRCUIT

[75] Inventors: Leonard Moore, Northridge; Jerry A. Durr, Newbury Park, both of Calif.

[73] Assignee: Moore Industries Inc., Sepulveda, Calif.

[21] Appl. No.: 34,573

[22] Filed: Apr. 30, 1979

Related U.S. Application Data

[63] Continuation-in-part of Ser. No. 891,622, Mar. 30, 1978, abandoned.

[51] Int. Cl.³ .............................................. H05K 7/20
[52] U.S. Cl. ................................. 361/388; 361/424; 361/426; 174/35 R
[58] Field of Search ............... 361/356, 357, 331, 380, 361/386, 388, 389, 424, 332, 426; 174/35 R, 51, 52 R; 357/79; 362/194, 195, 201, 203-206; 200/301; 206/521, 591; 220/413

[56] References Cited

U.S. PATENT DOCUMENTS

| 1,444,131 | 2/1923 | Nelson | 220/413 |
| 1,866,600 | 7/1932 | Torgerson | 362/201 |
| 1,969,196 | 8/1934 | Rauch | 362/201 |
| 2,932,546 | 4/1960 | Marggraf | 206/591 |
| 3,485,933 | 12/1969 | Flachbarth | 174/51 |
| 4,149,219 | 4/1979 | Kraft | 361/386 |

OTHER PUBLICATIONS

Air-Cooled Semiconductor Chip Module Configurations, C. G. Metreaud, IBM Tech. Discl. Bull., vol. 20, No. 7, Dec., 1977, p. 2697.
Metal Wool Heat Stud, B. J. Rowkese, IBM Tech. Discl. Bull., vol. 20, No. 3, Aug. 1977, p. 1122.

Primary Examiner—Gerald P. Tolin
Attorney, Agent, or Firm—Julius Louis Rubinstein

[57] ABSTRACT

A housing for an electrical circuit is to be releasably mounted in an explosion-proof box without modifying the structure of the box. The housing is provided with at least one spring which extends away from the housing into engagement with an inner surface of the box. This engagement between the spring and the inner surface of the box deflects the spring, exerting force on the housing in such a way as to resiliently hold the housing inside the box.

15 Claims, 10 Drawing Figures

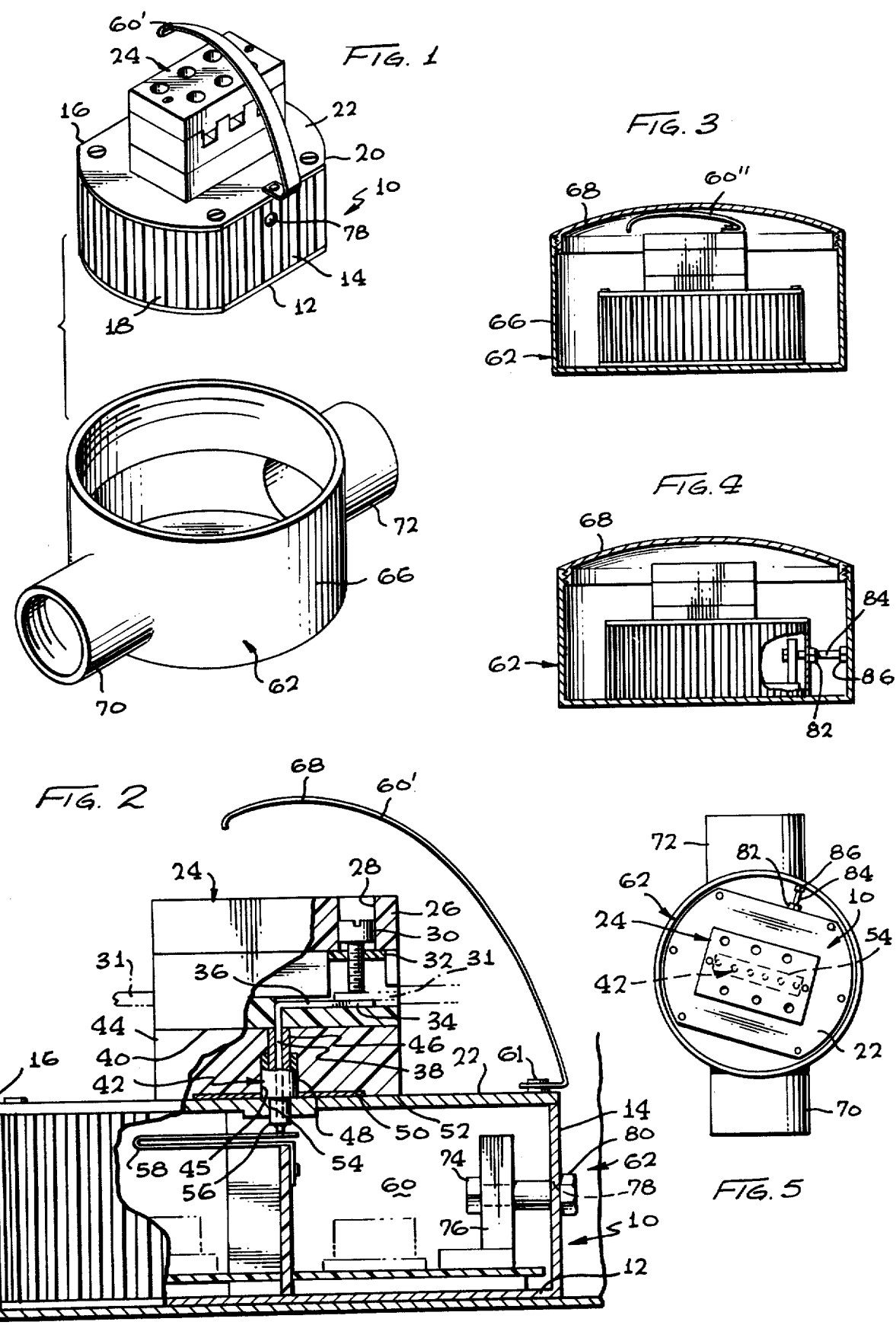

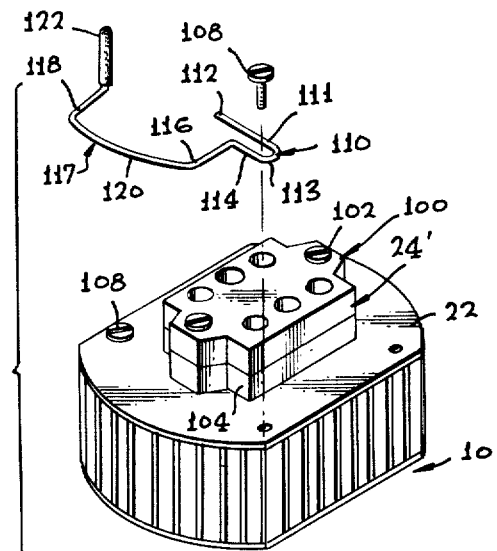
FIG. 7
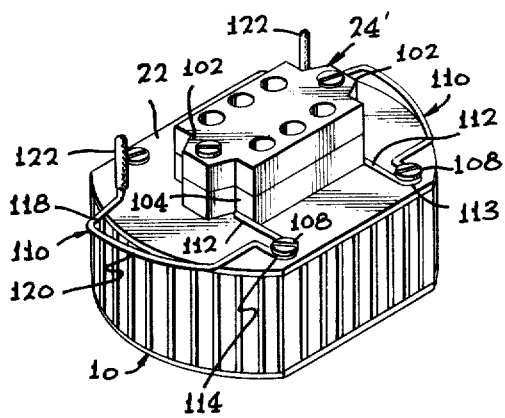
FIG. 6
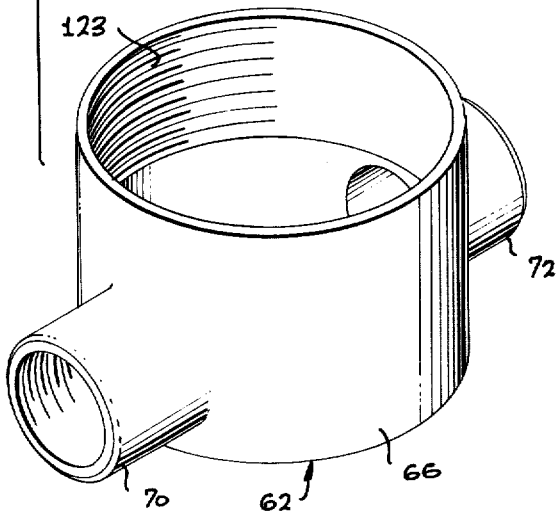
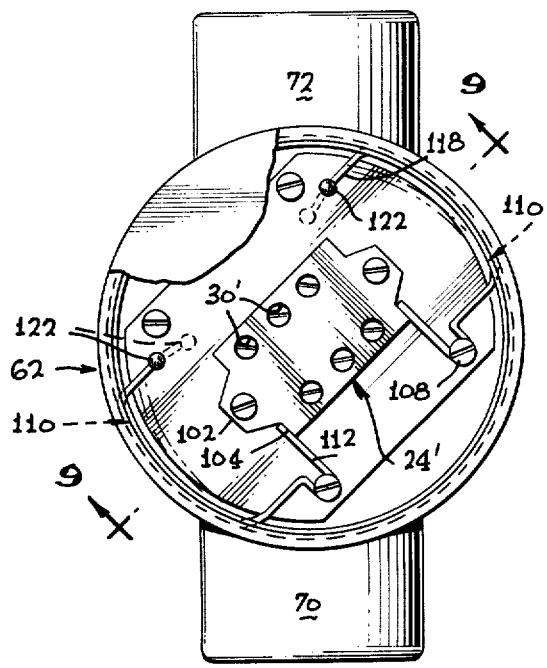
FIG. 8
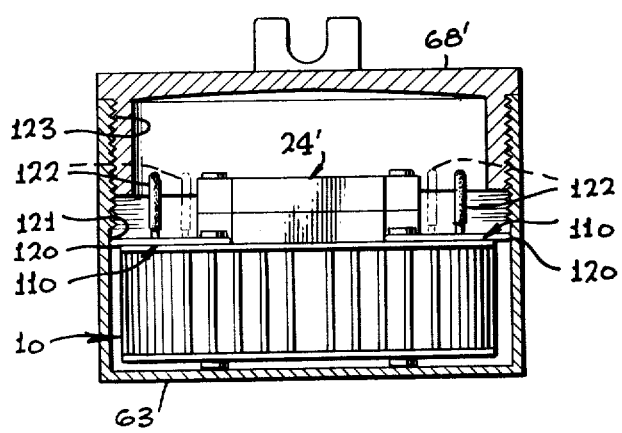
FIG. 9
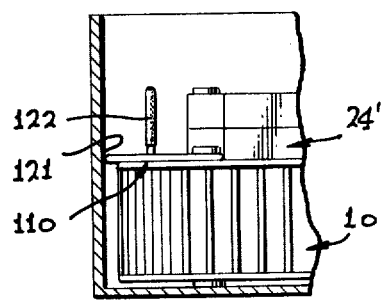
FIG. 10

HOUSING FOR AN ELECTRICAL CIRCUIT

This application is a continuation in part of patent application Ser. No. 891,622 filed Mar. 30, 1978, now abandoned, and relates to a housing for an electrical circuit, and, more particularly, to a housing which can be mounted inside a protective box without any modification of the box.

BACKGROUND AND BRIEF SUMMARY

Electrical circuits mounted inside housings are used in a large variety of locations. Sometimes the circuits are used in an explosive atmosphere or where they must be protected from moisture or accidental blows. To protect them, the housings for these circuits are protectively mounted inside boxes such as condulets. Condulets are generally cylindrical in shape with a circular lid and with cable inlet and outlet tubes which communicate with the interior of the condulet for receiving electrical cables which are connected to the circuit. When the housings containing the circuits are mounted inside the condulets, they are isolated from the surrounding atmosphere, which could be explosive, humid, or corrosive, and they are protected against accidental blows.

Considerations of economy and ease of assembly make it desirable for the housing to be rapidly and releasably mounted inside the condulet without any modification of the condulet's structure.

In addition, the circuits in the housing may contain electrical components which generate considerable heat. If the housing containing the electrical circuit is itself mounted inside a condulet, heat could build up inside the housing to a level which could endanger the circuit.

Besides this, the operation of the electrical circuit inside the housing could be affected by unwanted RF signals which penetrate the housing and it is important to be able to construct the housing in such a way that this does not happen.

What is needed, therefore, and comprises an important object of this invention, is to provide a housing for an electrical circuit which can be easily and releasably mounted inside a condulet without any modification of the condulet.

Another object of this invention is to provide a housing which can be resiliently mounted inside a condulet without any modification of the condulet and without any interference with the cable inlet and cable outlet tubes in the condulet.

A further object of this invention is to provide a housing for an electrical circuit which is designed to be releasably and rigidly mounted inside a condulet and which is provided with means for preventing circuit components inside the housing from raising the temperature inside the housing to a level which could affect the performance of the circuit.

Yet a further object of this invention is to provide a housing for a circuit which has means for preventing unwanted RF signals from entering the interior of the housing.

These and other objects of this invention will become more apparent when better understood in the light of the accompanying specifications and drawings wherein:

FIG. 1 is an exploded perspective view of the condulet and the housing constructed according to the principles of this invention.

FIG. 2 is an elevated view of the housing partly in section constructed according to the principles of this invention, showing the mounting spring attached to the top cover of the housing.

FIG. 3 is a modified elevated view showing the housing resiliently mounted inside a condulet and showing the mounting spring attached to the upper surface of the terminal block.

FIG. 4 discloses a modified housing constructed according to the principles of this invention and showing a thermal connection between the electrical circuit and the housing in an embodiment wherein the housing is rigidly mounted inside the condulet.

FIG. 5 is a plan view of the condulet shown in FIG. 4 showing the housing positioned inside.

FIG. 6 is a perspective view of the housing showing modified arcuate mounting springs attached to the top cover of the housing.

FIG. 7 is an exploded perspective view of the condulet and the housing showing a perspective view of a modified mounting spring.

FIG. 8 is a plan view of the housing with modified mounting springs showing the housing mounted inside a condulet.

FIG. 9 is an elevational view, partly in section, showing the housing with the modified mounting springs inside a condulet, and showing the housing held in position by a coaction between the modified mounting springs and the internal threads in the condulet.

FIG. 10 is a view like that shown in FIG. 9, showing the housing with the modified mounting springs held inside a condulet without internal threads.

Referring now to FIG. 1 of the drawing, a housing indicated generally by the reference numeral 10 comprises a base wall 12, parallel planar side walls 14 and 16, curved end walls 18 and 20, along with a removable top cover or wall 22.

An electrical terminal block 24 is releasably mounted on the cover 22. The terminal block includes an insulating cover 26 formed with screw-adjusting holes 28 (see FIG. 2). Electrically conductive screws 30 are in threaded engagement with nuts 32 mounted inside the terminal block. The terminal block also includes L-shaped connectors 34. These L-shaped connectors have one portion 36 which is transverse to and facing the screws 30, whereby leads 31 may be attached to the connector by inserting them between the end of the screws 30 and transverse portion 36 of the connector and rotating the screws 30, to clamp the leads between them. The other portion 38 transverse to portion 36 extends out of the base 40 of the terminal block.

In order to prevent unwanted RF signals from entering the housing 10 through the terminal block or leads 31 connected to the connectors 34, cylindrical RF ferrite filters 42 are used. In this embodiment, six linearly and equally spaced RF filters are mounted inside an insulating block 44 equidistant from the sides of the block. The block 44 is connected to the base of the terminal block 24. These ferrite filters 42 comprise a filter tube 46 and a surrounding ferrite tube 48. The portion 38 of the L-shaped connector 34 extends completely through and is soldered inside the filter tube 46.

In addition each ferrite tube 46 is electrically connected by soldering or any other suitable means to the outer surface of the ferrite tube 48 and to the ground plane 50 mounted at the base 52 of the insulating block 44. With this arrangement, each of the RF filters will have the same ground potential. It is noted that the ground plane is held in spaced relationship to the end of the terminal block. This is because of the spacing effect of the insulating block and the RF filters which are embedded in the counter sunk holes 45 which extend upward from the base 52 of the insulating block. This holds the RF filters rigidly in position. The cover 22 of the housing 10 is provided with an elongated slot 54 through which the end portions 56 of the six linearly spaced RF filters extend (see FIGS. 2 and 5).

In this embodiment, the extreme end 56 of each of the L-shaped connector portions 38 are soldered or electrically connected to an elongated flexible connector strip 58 so that access may be had to the interior 60 of the housing without disconnecting the terminal block from the circuit inside the housing. In this way, when the leads are connected to the terminal block 24 and the cover 22 is secured on the housing 10, RF signals are prevented from entering the interior of the housing to electrically disturb the circuit.

The housing 10 is to be mounted inside a condulet 62. The condulet is provided with a base 63, side walls 66 and removable top cover or lid 68, and cable inlet and cable outlet tubes 70 and 72 which communicate with the interior of the housing.

From the standpoint of cost of installation, it is important for the housing 10 to be releasably mounted inside the condulet 62 without any modification of the structure of the condulet.

In addition, it is desirable for the housing to be resiliently mounted inside the condulet to protect it from shocks and jars and the mounting must be done in such a way that the cable inlet and cable outlet tubes communicating with the interior of the housing are not blocked in any way.

To do this, in the embodiment shown in FIG. 2, a leaf or wire spring 60' which, in the embodiment shown, happens to be arcuate, is secured at one end to a screw 61 which is attached to the top lid 22 of the housing 10. This spring curves over the top of the housing as shown in FIG. 2 and the vertical distance between the base 64 of the housing and the topmost part 63 of the leaf spring is greater than the height of the walls 66 of the condulet 62. Consequently, when the housing 10 is placed inside the condulet and the lid 68 of the condulet is screwed on, the inner surface of the lid bears against the leaf spring and bends it down whereby the pressure of the leaf spring against the inner surface of the lid of the condulet resiliently holds the housing in position inside the condulet. Moreover, this is done without in any way interfering with the cable inlet and outlet tubes 70 and 72 which communicate with the interior of the condulet (see FIG. 1). This is because the spring 60' is in upwardly spaced relationship to the cable inlet and cable outlet tubes. The advantage of this mounting arrangement is that terminal block 24 can be removed and replaced by one of a different thickness without requiring the mounting spring 60' to be replaced.

In the embodiment shown in FIG. 3, the mounting spring 60" is attached to the upper surface of the terminal block. This permits a smaller, less expensive spring to be used, but if the terminal block 24 is replaced by one of a different thickness, the mounting spring 60" might have to be changed. In all other respects, the mounting spring 60' shown in FIG. 2 and the one shown in FIG. 3 resiliently hold the housing in position in the condulet as shown in FIG. 3.

Another problem which may occur when the housing is mounted inside of the condulet is heat buildup, the extent of which depends on the type of circuit inside the housing 10. If heat buildup is potentially damaging, it can be kept to safe levels if a bolt 74 is mounted in tight physical engagement with a heat producing element, such as a power transistor 76 inside the housing. This bolt extends through a hole 78 in a side wall 16 of the housing and would be attached to the side wall by a nut 80 (see FIG. 2). This arrangement makes the housing serve as a heat sink and limits temperature buildup inside the housing.

If this is not sufficient, bolt 74, or another bolt extending from the side walls of the housing, could be rotated into engagement with the side walls of the condulet. One way to do this would be to attach an elongated nut 82 to the side of the housing and have a bolt 84 mounted inside the nut (see FIGS. 4 and 5). The length of the bolt 84 would be such that by rotating it, the bolt could move out of the nut into engagement with the inner surface of the side walls of the condulet. This arrangement, in addition to providing a heat transfer from the interior of the housing to the condulet, also provides a means for rigidly holding the housing in a fixed position inside the condulet in circumstances where a rigid mounting is necessary, and where it is important that the housing be secured to the condulet without in any way modifying the structure of the condulet. For a better heat transfer between the bolt and the housing to the inner surface of the condulet, the head 86 of the bolt may be shaped to conform to the shape of the inner surface of the housing.

In the embodiment shown in FIG. 6, the housing 10 including the top wall or cover 22 is like that shown in FIG. 1. The terminal block 24' is the same as that shown in FIG. 1 except that the opposed ends 100 of terminal block 24 are provided with longitudinally extending, centrally disposed mounting bosses 102 that project out intermediate to the end walls of the terminal block 24. In this way, bolts or screws, extending through the mounting bosses 102, may be secured to the top cover 22 to hold the terminal bock to the housing, see FIG. 6. This arrangement defines spaced flat end wall sections 104 at opposite ends of the mounting bosses which are transverse to the sides 106 of the terminal block.

As seen in FIG. 6, the lid 22 is held on the housing by means of mounting screws 108. A pair of mounting springs 110 are mounted on the lid of the housing. These mounting springs may be formed from spring wire and have a generally narrow channel-shaped portion 111. The web or bow 113 of this channel-shaped portion is sized to curve around the shaft of mounting screw 108. One leg 112 of the channel-shaped portion is larger than the other and is sized so when the bow 113 of the channel-shaped portion curves around mounting screw 108, the leg 112 extends over the lid 22 and bears against the flat end stop section 104 of the terminal block 24, see FIG. 6. This stops the spring 110 from rotating around screw 108 for reasons to become apparent below.

The other leg 114 is shorter than leg 112 and has a bent leg portion 116 generally transverse to portion 114. This leg portion 116 forms part of a second channel-shaped portion 117 which lies in the same plane as the first channel portion. This channel-shaped portion 117 includes a second free leg portion 118 and an arcuate connecting web or bow portion 120 which is long in comparison to the length of the leg portions 116 and 118. The extreme end 122 of free leg 118 is bent upward transverse to the plane of the first and second channel portions of the spring and, as will become apparent below, serves as a spring deflecting or actuating portion. An identical spring 110 is mounted under mounting screw 108 at the opposite end of the housing, see FIG. 6.

The connecting or arcuate web portions 120 of the springs 110 are shaped so that when the housing is out of the condulet and the springs are not in tension, the arcuate web portions 120 project laterally in opposite directions out beyond the end walls of the housing, see FIG. 6, and the distance between the arcuate portions of the springs 110 at the opposite sides of the housing is greater than the internal diameter of the condulet.

When the actuating portions 122 of the springs 110 are squeezed together against the force of the springs, the arcuate web portions 120 are pulled toward each other over the top of the cover 22. This is because the springs 110 cannot rotate on the mounting screws because the spring leg portions 112 bear against the flat surfaces 104 of the terminal block.

With the actuating portions 122 squeezed together, the housing can be inserted in the condulet with the base of the housing resting on the inner surface of the bottom of the condulet. Then, if the actuating portions 122 are released, the arcuate web portions 122 move away from each other and engage the inner surface 121 of the opposite sides of the condulet.

The material composing the springs 110 and the shape of the springs is selected so the engagement between the arcuate portions 120 of the springs and the inner surfaces of the condulet is with sufficient force to resiliently hold the housing in position in the condulet.

There are two kinds of condulets, some are internally threaded so the condulet cover or lid 68 can be screwed on, and some are not internally threaded. If the condulet is internally threaded, as shown in FIG. 9, the springs 110, when released, expand so that the arcuate portions 120 move into engagement with the inner surface 121 of the condulet just below the internal threads 123. With this arrangement, the housing will be resiliently and securely held inside the housing. This permits the housing to stay in position even when the condulet is held upside-down with the cover off. In contrast, in the embodiment shown in FIG. 1, the housing could not be resiliently held in the condulet unless the cover was attached, see FIG. 3.

If the housing has no internal thread, the housing could still be held in position by the force of the springs alone against the internal surface 121 of the condulet. However, in such a case, a stronger spring would have to be used, see FIG. 10.

Having shown and described the invention, what I claim is new is as follows:

1. A housing for an electrical circuit, said housing having a top wall, a bottom wall, and connecting side walls, an accurate leaf spring, one end of said leaf spring in fixed relation to said top wall, the opposite end of said leaf spring curved above the top wall, a condulet, said condulet having a base, side walls, cable inlet and cable outlet tubes, and a removable cover, said housing positioned inside the condulet with the bottom wall of the housing resting on the base of the condulet, the distance between the bottom wall of the housing and the topmost part of the arcuate leaf spring when in a free condition greater than the distance between the base of the condulet and the top edge of the side walls of the condulet, the inner surface of the condulet cover engaging the topmost part of the leaf spring and bending it down in such a way that the engagement between the inner surface of the condulet cover and the leaf spring resiliently holds the housing in position inside the condulet without interfering with the cable inlet and cable outlet tubes which communicate with the interior of the condulet.

2. The housing described in claim 1 including an electrical circuit in said housing, said electrical circuit inside the housing generating heat, said housing including thermal conducting means connecting said circuit to the walls of the housing whereby the housing serves as a heat sink to prevent the buildup of destructive temperatures inside the housing.

3. The housing described in claim 2 including an electrical connector secured to the housing to provide means for making an electrical connection to the circuit inside the housing, said electrical connector including RF filters for preventing the entry of RF signals to the interior of the housing through the electrical connector.

4. A housing for an electrical circuit, said housing having a top wall, a bottom wall, and connecting side walls, a terminal block mounted on the top wall of said housing, said terminal block having an upper terminal block surface, an arcuate leaf spring, one end of said leaf spring secured to said upper terminal block surface, the opposite end of said leaf spring curved above the upper terminal block surface, a condulet, said condulet having a base, side walls, cable inlet and cable outlet tubes, and a removable cover, said housing positioned inside the condulet with the bottom wall of the housing resting on the base of the condulet, the distance between the bottom wall of the housing, and the topmost part of the arculate leaf spring when in a free condition being greater than the distance between the base of the condulet and the top edge of the side walls of the condulet, the inner surface of the condulet cover engaging the topmost part of the leaf spring and bending it down in such a way that the engagement between the inner surface of the condulet cover and the topmost part of the leaf spring resiliently holds the housing in position inside the condulet without interfering with the cable inlet and cable outlet tubes which communicate with the interior of the condulet.

5. A housing for an electrical circuit, said housing having a top wall, a bottom wall, and connecting side walls, at least one spring, a first portion of said spring in fixed relation to said top wall, a condulet, said condulet having a base wall, side walls, cable inlet and cable outlet tubes, and a removable cover, said housing positioned inside said condulet with at least one wall of the housing engaging at least one inner surface of the condulet, a second portion of said spring in vertically spaced relation to said top wall and to said cable inlet and cable outlet tubes extends into engagement with an inner surface of said condulet, said second portion selected and dimensioned so that said engagement with the said inner surface of the condulet deflects said spring with sufficient force to resiliently hold the housing in position inside the condulet without interfering with said cable inlet and cable outlet tubes which communicate with the interior of the condulet.

6. The housing described in claim 5 with said top wall attached to the housing by means of screws, said first portion of said spring secured to said top wall by one of said screws, said second portion of said spring being free.

7. A housing for an electrical circuit, said housing having a top wall, a bottom wall, and connecting side walls, a pair of springs connected to the top wall and disposed generally parallel to and over said top wall, each of said springs having a portion disposed at opposite sides of the housing, a condulet, said condulet having a base, side walls, a removable cover, and cable inlet and cable outlet tubes, said housing positioned inside the condulet with the bottom wall of the housing resting on the base of the condulet, said portion of said springs at opposite sides of the housing in vertically spaced relation to said cable inlet and cable outlet tubes and extending over said top wall beyond the opposite side walls of the housing in opposite direction and into engagement with the inner surfaces of the opposite side walls of the condulet, said portions of said springs selected and dimensioned so that they engage said inner surfaces of the condulet and are deflected thereby with sufficient force to resiliently hold the housing in position inside the condulet without interfering with the cable inlet and cable outlet tubes which communicate with the interior condulet.

8. A housing for an electrical circuit, said housing having a top wall, a bottom wall, and connecting side walls, said top wall removably attached to the top wall of the housing, two screws attached to the top wall of the housing, a pair of springs, a portion of each spring secured by said two screws to said top wall of said housing, the remaining portions of each spring disposed at opposite sides of the housing, a stop member extending upward from the top wall of the housing, a part of each spring engaging a portion of said stop member to prevent rotation of said springs around said two screws, a condulet, said condulet having a base, side walls, a removable cover, and cable inlet and cable outlet tubes, said housing positioned inside the condulet with the bottom wall of the housing resting on the base of the condulet, said remaining portions of the springs being at opposite sides of the housing in vertically spaced relation to said cable inlet and cable outlet tubes and extending over said top wall beyond the opposite side walls of the housing in opposite directions and into engagement with the inner surfaces of the opposite side walls of the condulet, said remaining portions of said springs selected and dimensioned so with the housing positioned inside the condulet said remaining portions of said springs engage said inner surfaces of the condulet and are deflected thereby with sufficient force to resiliently hold the housing in position inside the condulet without interfering with the cable inlet and cable outlet tubes which communicate with the interior of the condulet.

9. A housing for an electrical circuit, said housing having a top wall, a bottom wall, and connecting side walls, said top wall removably attached to said housing by means of screws, a pair of springs, a portion of each spring secured to at least one of said screws holding the top wall to said housing, other portions of each spring disposed at opposite sides of the housing, a terminal block mounted on the top wall of the housing, a part of each spring engaging a part of said terminal block to prevent rotation of said springs around said at least one of said screws, a condulet, said condulet having a base, side walls, a removable cover, and cable inlet and cable outlet tubes, said housing positioned inside the condulet with the bottom wall of the housing resting on the base of the condulet, said other portions of the springs at opposite sides of the housing in vertically spaced relation to said cable inlet and cable outlet tubes and extending over said top wall beyond the opposite side walls of the housing and in opposite directions into engagement with the inner surfaces of the opposite side walls of the condulet, said other portions of said springs selected and dimensioned so that said springs engage said inner surfaces of the condulet and are deflected thereby with sufficient force to resiliently hold the housing position inside the condulet without interfering with the cable inlet and cable outlet tubes which communicate with the interior of the condulet.

10. A housing for an electrical circuit, said housing having a top wall, a bottom wall, and connecting side walls, said top wall removably attached to said housing by means of screws, a pair of springs, a part of each spring curved around one of said screws and secured thereby to said top wall, another portion of each spring disposed at opposite sides of the housing, a terminal block mounted on the top wall of the housing, a part of each spring engaging a surface of said terminal block to prevent rotation of said spring around the screws to which they are attached, a condulet, said condulet having a base, side walls, a removable cover, and cable inlet and cable outlet tubes, said housing positioned inside the condulet with the bottom wall of the housing resting on the base of the condulet, said another portion of each spring at opposite sides of the housing being in vertically spaced relation to said cable inlet and cable outlet tubes and extending over said top wall beyond the opposite side walls of the housing in opposite directions and into engagement with the inner surfaces of the opposite side walls of the condulet, the said another portion of each of said springs selected and dimensioned so that said another portion of each of said springs engages a respective inner surface of the condulet and is deflected thereby with sufficient force to resiliently hold the housing in position inside the condulet without interfering with the cable inlet and cable outlet tubes which communicate with the interior of the condulet.

11. A housing for an electrical circuit, said housing having a top wall, a bottom wall, and connecting side walls, said top wall removably attached to said housing by means of mounting screws, a pair of identical springs, each spring having a first narrow channel portion and a second broad channel portion, said first and second channel portions of the springs being in the same plane but extending transverse to each other, the web of each of said first channel portions wrapped around a mounting screw at each end of said housing, the second channel portion of each spring extending out beyond the opposite ends of the housing, a terminal block mounted on the top wall of the housing, one of the legs of the first channel portion of each spring engaging a surface of said terminal block to prevent rotation of the web of said first narrow channel portion of each spring around the attached mounting screw, a condulet, said condulet having a base, side walls, a removable top cover, and cable inlet and cable outlet tubes, said housing positioned inside the condulet with the bottom wall of the housing resting on the base of the condulet, said springs in vertically spaced relation to said cable inlet and cable outlet tubes, the webs of said second channel portions of said springs extending in opposite directions beyond the end walls of the housing and into engagement with the inner surfaces of the opposite side walls of the condulet whereby said springs are deflected thereby with sufficient force to resiliently hold the housing in position inside the condulet without interfering with the cable inlet and cable outlet tubes which communicate with the interior of the condulet.

12. The housing described in claim 11 wherein each second channel portion has a free leg, a part of the said free leg of each second channel portion of each spring being bent transverse to the plane of said spring and to the plane of the top wall of the housing and defining a spring deflecting portion at each end of the housing, said spring deflecting portions disposed so when they are squeezed together against the force of the springs, they pull the second channel portions toward each other over the top cover of the housing thereby permitting the housing to be inserted inside the condulet or removed therefrom, whereby releasing the squeezed spring deflecting portions while the housing is inside the condulet permits the springs to move the second channel portions away from each other into engagement with the inner surfaces of the opposite sides of the condulet with sufficient force to resiliently hold the housing inside the condulet.

13. The housing described in claim 12 wherein said terminal block has parallel side walls, the end walls of the said terminal block provided with longitudinally extending centrally disposed mounting bosses that project out intermediate the side walls of the terminal block defining thereby flat end wall stop sections at opposite ends of the mounting bosses, said one leg of each of the first channel portions of the springs engaging said flat end stop sections whereby the springs are prevented from rotating on the mounting screws when the spring deflecting portions are squeezed together.

14. The housing described in claim 13 including an electrical circuit in said housing, an electrical connector secured to the housing to provide an electrical connection to the circuit inside the housing, said electrical connector including RF filters for preventing the entry of RF signals to the interior of the housing through said electrical connector.

15. The housing described in claim 1 wherein said one end of said leaf spring is secured to said top wall of said housing.

* * * * *